United States Patent
Mitta et al.

(10) Patent No.: US 10,896,989 B2
(45) Date of Patent: Jan. 19, 2021

(54) HIGH EFFICIENCY BACK CONTACT TYPE SOLAR CELL, SOLAR CELL MODULE, AND PHOTOVOLTAIC POWER GENERATION SYSTEM

(71) Applicant: Shin-Etsu Chemical Co., Ltd., Tokyo (JP)

(72) Inventors: Ryo Mitta, Kamisu (JP); Hiroshi Hashigami, Annaka (JP); Takenori Watabe, Annaka (JP); Hiroyuki Ohtsuka, Nagano (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 288 days.

(21) Appl. No.: 15/575,339

(22) PCT Filed: Dec. 13, 2016

(86) PCT No.: PCT/JP2016/087128
§ 371 (c)(1),
(2) Date: Nov. 17, 2017

(87) PCT Pub. No.: WO2018/109849
PCT Pub. Date: Jun. 21, 2018

(65) Prior Publication Data
US 2019/0221700 A1 Jul. 18, 2019

(51) Int. Cl.
*H01L 31/0224* (2006.01)
*H01L 31/05* (2014.01)
(Continued)

(52) U.S. Cl.
CPC .... *H01L 31/0682* (2013.01); *H01L 31/02366* (2013.01); *H01L 31/022458* (2013.01);
(Continued)

(58) Field of Classification Search
None
See application file for complete search history.

(56) References Cited

U.S. PATENT DOCUMENTS 4,163,678 A * 8/1979 Bube ............... H01L 21/283
106/1.12
5,431,741 A * 7/1995 Sakaguchi ........ H01L 31/02243
136/244
(Continued)

FOREIGN PATENT DOCUMENTS

JP 10-117008 A 5/1998
JP 2001-284616 A 10/2001
(Continued)

OTHER PUBLICATIONS

International Search Report in PCT/JP2016/087128, dated Mar. 7, 2017, 3pp.
(Continued)

*Primary Examiner* — Tamir Ayad
(74) *Attorney, Agent, or Firm* — Hauptman Ham, LLP (57) ABSTRACT

In a back contact type solar cell in which an impurity diffusion layer where second conductive type impurities are diffused is formed on a back surface, as a non-light receiving surface, of a first conductive type semiconductor substrate, and an electrode in contact with the impurity diffusion layer is provided, a surface concentration of the impurities in the impurity diffusion layer is not less than $5 \times 10^{17}$ atms/cm$^3$ and not more than $5 \times 10^{19}$ atms/cm$^3$, and a diffusion depth of the impurities in the impurity diffusion layer is not smaller than 1 μm and not larger than 2.9 μm from a top of the back surface. It is thereby possible to provide a high efficiency back contact type solar cell which can be manufactured by a simple method at low cost.

6 Claims, 6 Drawing Sheets

(51) Int. Cl.
*H01L 31/068* (2012.01)
*H01L 31/18* (2006.01)
*H01L 31/0236* (2006.01)

(52) U.S. Cl.
CPC ...... *H01L 31/0516* (2013.01); *H01L 31/1804* (2013.01); *Y02E 10/547* (2013.01); *Y02P 70/50* (2015.11)

(56) References Cited

U.S. PATENT DOCUMENTS

| | | | |
|---|---|---|---|
| 5,961,742 A | 10/1999 | Tange et al. | |
| 2002/0011590 A1 | 1/2002 | Nagashima | |
| 2003/0092226 A1 | 5/2003 | Nagashima et al. | |
| 2010/0096014 A1* | 4/2010 | Iida | H01B 1/16 136/265 |
| 2010/0243041 A1 | 9/2010 | Carlson et al. | |
| 2010/0294349 A1* | 11/2010 | Srinivasan | H01L 21/2255 136/255 |
| 2011/0023956 A1 | 2/2011 | Harder | |
| 2014/0145122 A1 | 5/2014 | Sawai et al. | |
| 2014/0179054 A1* | 6/2014 | Recaman Payo | H01L 21/02532 438/87 |
| 2015/0075595 A1 | 5/2015 | Gall | |
| 2017/0025561 A1 | 1/2017 | Kohata | |

FOREIGN PATENT DOCUMENTS

| | | |
|---|---|---|
| JP | 2003-168807 A | 6/2003 |
| JP | 2005-322780 A | 11/2005 |
| JP | 2011-49514 A | 3/2011 |
| JP | 2011-507246 A | 3/2011 |
| JP | 2012-521662 A | 9/2012 |
| JP | 2015-171993 A | 10/2015 |
| JP | 2016-51767 A | 4/2016 |
| WO | 2011/111192 A1 | 9/2011 |
| WO | 2015/151288 A1 | 4/2017 |

OTHER PUBLICATIONS

Written Opinion in PCT/JP2016/087128, dated Mar. 7, 2017, 9pp.
Extended European Search Report in EP Application No. 16885444.6, dated Jan. 31, 2018, 7pp.

* cited by examiner

HIGH EFFICIENCY BACK CONTACT TYPE SOLAR CELL, SOLAR CELL MODULE, AND PHOTOVOLTAIC POWER GENERATION SYSTEM

RELATED APPLICATIONS

The present application is a National Phase of International Application Number PCT/JP2016/087128, filed Dec. 13, 2016.

TECHNICAL FIELD

The present invention relates to a high efficiency back contact type solar cell having favorable conversion efficiency, a solar cell module, and a photovoltaic power generation system.

BACKGROUND ART

A solar cell is typically made of multi-crystalline silicon, single-crystalline silicon, or the like, in a plate shape with a size of 100 to 150 mm square and a thickness of 0.1 to 0.3 mm, and a main material for the solar cell is a p-type semiconductor substrate doped with p-type impurities such as boron. In this solar cell, an n-type diffusion layer (emitter layer) and an antireflection film are formed on a light receiving surface that receives sunlight, and an electrode is formed penetrating through the antireflection film so as to be in contact with the emitter layer.

In the solar cell, the electrode is essential for taking out a current obtained by photovoltaic conversion. However, since sunlight cannot enter the cell beneath the electrode regions on the light receiving surface due to shielding by the electrode, the larger the area of the electrode, the more the conversion efficiency degrades and the current decreases. Such a loss of the current due to the electrode formed on the light receiving surface is called a shadow loss.

In contrast, a back contact type solar cell has no shadow loss, with no electrode formed on the light receiving surface, and can thus absorb therein almost 100% of incident sunlight except for a small amount of reflected light that the antireflection film failed to prevent from reflection. It is thus possible in principle to achieve high conversion efficiency.

Figure 1:
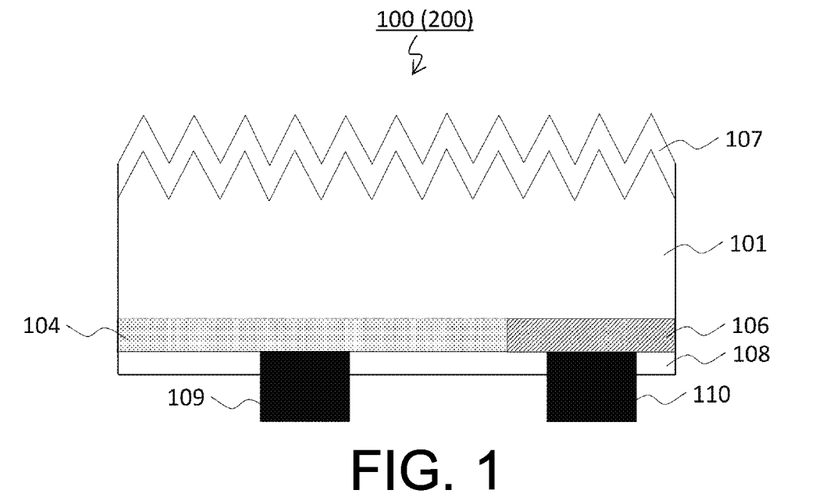
FIG. 1 is a view that illustrates one example of a configuration of a high efficiency back contact type solar cell.

Typically, a back contact type solar cell 100 has a sectional structure as illustrated in FIG. 1. The back contact type solar cell 100 includes a semiconductor substrate 101, an emitter layer 104, a BSF (Back Surface Field) layer 106, antireflection films with passivation properties 107, 108, and electrodes 109, 110.

The semiconductor substrate 101 is a main material for the back contact type solar cell 100, and made of single-crystalline silicon, multi-crystalline silicon, or the like. While either a p-type substrate or an n-type substrate may be used, an n-type silicon substrate doped with n-type impurities such as phosphorus is often used. Hereinafter, a description will be given taking as an example the case of using the n-type silicon substrate. For the semiconductor substrate 101, a substrate in a plate shape with a size of 100 to 150 mm square and a thickness of 0.1 to 0.3 mm is preferred, and one main surface is used as a light receiving surface, and the other main surface is used as a non-light receiving surface (back surface).

A concave-convex structure for optical confinement is formed on the light receiving surface. The concave-convex structure is obtained by soaking the semiconductor substrate 101 in an acid or alkali solution for a certain period of time. Typically, this concave-convex structure is called a texture.

The back surface is formed with the emitter layer 104 being a p-type diffusion layer doped with p-type impurities such as boron, and the BSF layer 106 being an n-type diffusion layer doped with n-type impurities such as phosphorus. Either the emitter layer 104 or the BSF layer 106 may be formed first. When the emitter layer 104 is to be formed first, for example, it is formed in the following manner.

First, a protective layer 102 such as a silicon oxide layer is formed on the entire surface of the semiconductor substrate 101. Specifically, a silicon oxide layer with a thickness of approximately 30 to 300 nm is formed by, for example, a thermal oxidation method in which the semiconductor substrate 101 is set in an oxygen atmosphere at a high temperature of 800 to 1100° C. Subsequently, by screen printing, resist paste is applied to the regions of the protective layer 102 other than regions for forming the emitter layer 104 on the back surface of the semiconductor substrate 101, and the resist paste is then cured. The semiconductor substrate 101 is then soaked into a hydrofluoric acid aqueous solution to remove the protective layer 102 covering the region for forming the emitter layer 104, and is further soaked into acetone or the like to remove the resist paste 103. Then, p-type impurities are diffused by, for example, the thermal diffusion method in the region where the protective layer 102 has been removed, to form the emitter layer 104 as a p-type diffusion layer and a glass layer 105. Specifically, for example by placing this semiconductor substrate 101 in a high temperature gas at 800 to 1100° C. containing $BBr_3$, boron is diffused in the regions not formed with the protective layer 102, to form the glass layer 105 and the emitter layer 104 with sheet resistance of approximately 20 to 300Ω/□. The semiconductor substrate 101 is then soaked into a chemical such as a diluted hydrofluoric acid solution to remove the remaining protective layer 102 and the glass layer 105, and cleaned by deionized water. This leads to formation of the emitter layer 104 where p-type impurities are diffused in a desired region on the back surface of the semiconductor substrate 101.

Then, the BSF layer 106 is formed in the portion not formed with the emitter layer 104 on the back surface of the semiconductor substrate 101 in almost a similar procedure to the emitter layer 104.

The antireflection films with passivation properties 107, 108, made of SiN (silicon nitride) or the like are further formed on the light receiving surface formed with the texture and the back surface formed with the emitter layer 104 and the BSF layer 106, respectively.

The electrode 109 is formed so as to be in contact with the emitter layer 104, and the electrode 110 is formed so as to be in contact with the BSF layer 106. These electrodes may be formed by sputtering or the like after opening contacts by using etching paste or the like, or may be formed by using the screen printing method. In the case of using the screen printing method, conductive silver paste containing glass flit or the like is printed on the antireflection film with passivation property 108 and dried so as to be in contact with the emitter layer 104 and the BSF layer 106 after firing. By firing the conductive silver paste, the electrode 109 in contact with the emitter layer 104 and the electrode 110 in contact with the BSF layer 106 are respectively formed penetrating through the antireflection films with passivation properties 107, 108. The electrodes 109, 110 are each made up of a bus bar electrode for externally taking out a photo-generation current generated in the back contact type solar cell 100, and a current-collecting finger electrode in contact with the bus bar electrode (illustration omitted).

In the typical back contact type solar cell having the structure illustrated in FIG. 1, especially an impurity diffusion profile of the emitter layer has a great influence on the conversion efficiency of the solar cell. For example, reducing an amount of the impurities diffused into the emitter layer to lower a reverse saturation current density makes it possible to increase an open voltage of the solar cell and enhance the conversion efficiency thereof. However, when a surface concentration of the impurities decreases due to reduction in amount of the impurities diffused into the emitter layer, the contact resistance with the electrode in contact with the emitter layer typically increases to cause deterioration in conversion efficiency. For this reason, it has been considered preferable for improving the conversion efficiency to use a method of setting the diffusion profile where the surface concentration of the impurities is high and diffusion depth is small while the amount of the impurities diffused into the emitter layer is held small, to make the contact resistance as small as possible and also keep the reverse saturation current density from increasing within the possible range. In the case of using the above exemplified method for manufacturing the emitter layer, the emitter layer is often formed in the diffusion profile where the surface concentration of the impurities is high and the diffusion depth thereof is small.

The contact resistance between the emitter layer and the electrode is greatly influenced also by the size of the contact area between the emitter layer and the electrode. In the case of the conventional solar cell having the electrode on the light receiving surface, the finger electrode in contact with the emitter layer needs being thinned to minimize the electrode area so as to make the shadow loss caused by the electrode as small as possible. This makes sufficient reduction in contact resistance difficult and makes formation of the electrode costly. In contrast, in the back contact type solar cell, the electrode is formed on the non-light receiving surface, thereby eliminating the need for considering the shadow loss caused by the electrode. Hence in the case of the back contact type solar cell, it has been considered preferable to make the width of the finger electrode large to a certain extent so as to make the contact area between the emitter layer wide and the contact resistance small, and preferable to form a thin electrode so as to make a cross-sectional area (an area of a plane orthogonal to the contact surface) small to such an extent that lateral flow resistance does not become excessively large in order to keep the cost for forming the electrode low. In the case of the previously illustrated method for manufacturing the electrode by screen printing, an electrode having a large width and a small thickness is often formed.

However, in order to diffuse the impurities in the diffusion profile where the surface concentration of the impurities is high and the diffusion depth thereof is small, it is generally necessary to perform diffusion thermal treatment at high temperature for a short period of time. In this case, especially at the time of mass-production, non-uniformity in diffusion of the impurities is apt to occur, thus it is difficult to diffuse the impurities in a predetermined diffusion profile. Further, the electrode with a large width and a small thickness may accidentally increase a value of the contact resistance with the emitter layer, which has frequently caused a decrease in yield.

As countermeasures against such a problem, for example, Patent Document 1 discloses a method for manufacturing a solar cell in which a film containing a diffusion source is formed in a portion of a diffusion layer formed in a semiconductor substrate where an electrode is to be formed, and subjected to thermal treatment in a steam atmosphere, to form a highly concentrated diffusion layer only in a place immediately below the electrode. However, this method has a problem where, since the thermal treatment needs to be performed a plurality of times for forming the diffusion layer, the cost becomes high, and further, a lifetime killer such as heavy metal is diffused in the semiconductor substrate to easily cause a decrease in yield.

Patent Document 2 discloses a method for manufacturing a solar cell in which a dopant solution is applied to the substrate surface by ink jet printing to perform uniform diffusion. However, in the case of this method, there has been a problem where nozzle and the dopant solution are difficult to control in ink jet printing, and further, the diffusion source formation and the thermal treatment are performed as different steps to cause an increase in cost.

Patent Document 3 discloses a method for manufacturing a solar cell in which conductive paste is screen-printed a plurality of times, while a mask is replaced, to reduce resistance of an electrode. However, this method has a problem where a yield is apt to decrease due to displacement of the electrode and the cost is apt to increase due to an increase in amount of the conductive paste used.

Patent Document 4 discloses a method for manufacturing a solar cell in which an electrode is formed by so-called rotogravure printing to form an electrode accurately. However, this method has a problem where a roll and paste are difficult to control, and jam of the roll and a decrease in yield are apt to occur due to drying.

PRIOR ART REFERENCES

Patent Documents

Patent Document 1: WO 2015/151288
Patent Document 2: JP 2003-168807 A
Patent Document 3: WO 2011/111192
Patent Document 4: JP 2011-049514 A

SUMMARY OF THE INVENTION

Problem to be Solved by the Invention

An object of the present invention is to provide a high efficiency back contact type solar cell with favorable conversion efficiency, a solar cell module, and a photovoltaic power generation system, the cell having a small reverse saturation current density and small contact resistance between an emitter layer and an electrode, and being manufacturable by a simple method with good yield at low cost.

Means for Solving the Problems (1) A high efficiency back contact type solar cell of the present invention is a high efficiency back contact type solar cell in which an impurity diffusion layer where second conductive type impurities are diffused is formed on a back surface, as anon-light receiving surface, of a first conductive type semiconductor substrate, and an electrode in contact with the impurity diffusion layer is provided. In the solar cell, a surface concentration of the impurities in the impurity diffusion layer is not smaller than $5 \times 10^{17}$ atms/cm$^3$ and not larger than $5 \times 10^{19}$ atms/cm$^3$, and a diffusion depth of the impurities in the impurity diffusion layer is not smaller than 1 µm and not larger than 2.9 µm from a top of the back surface.

As thus described, by forming the emitter layer with a low surface concentration and a large diffusion depth as compared with the conventional one, it is possible to lower both the reverse saturation current density and the contact resistance, and thereby to achieve a high efficiency back contact type solar cell by a simple method at low cost.

(2) Sheet resistance of the impurity diffusion layer may be not smaller than 60Ω/☐ and not larger than 150 Ω/☐.

(3) A maximum value of an impurity concentration of the impurity diffusion layer may be not lower than $7 \times 10^{17}$ atms/cm$^3$ and not higher than $7 \times 10^{19}$ atms/cm$^3$. The impurity concentration of the impurity diffusion layer may become the maximum value at a position not less than 0.1 µm and not more than 1 µm deep from the top of the back surface. The electrode may be a sintered body containing at least glass flit, silver, and aluminum. A cross-sectional area of the electrode may be not smaller than 350 µm$^2$ and not larger than 1000 µm$^2$. The electrode may partially penetrate into the impurity diffusion layer, and a depth of the penetration may be not smaller than 0.1 µm and not larger than 1.9 µm from the top of the back surface.

It is thereby possible to suppress the contact resistance low to enhance the conversion efficiency, and also to suppress the manufacturing cost low.

(4) For example, the first conductive type may be an n-type, and the second conductive type may be a p-type.

(5) A solar cell module may be configured by electrically connecting a plurality of high efficiency back contact type solar cells.

(6) A photovoltaic power generation system may be configured by electrically connecting a plurality of solar cell modules.

DESCRIPTION OF EMBODIMENTS

Hereinafter, embodiments of the present invention will be described. A common constituent among the drawings including the drawings used for describing the prior art is provided with the same reference numeral.

A high efficiency back contact type solar cell 200 in the present invention has a similar structure to that of the conventional back contact type solar cell 100 illustrated in FIG. 1, and includes a semiconductor substrate 101, an emitter layer 104, a BSF layer 106, antireflection films with passivation properties 107, 108, and electrodes 109, 110. The semiconductor substrate 101 is a main material for the high efficiency back contact type solar cell 200, and made of single-crystalline silicon, multi-crystalline silicon, or the like. While either a p-type or an n-type may be used, in this text, a description will be given taking as an example the case of an n-type silicon substrate containing impurities such as phosphorus and having a specific resistance of 0.1 to 4.0 Ω·cm. For the semiconductor substrate 101, a substrate in a plate shape with a size of 100 to 150 mm square and a thickness of 0.05 to 0.30 mm is preferred, and one main surface is used as a light receiving surface, and the other main surface is used as a non-light receiving surface (back surface).

<Manufacturing Procedure>

Figure 2:
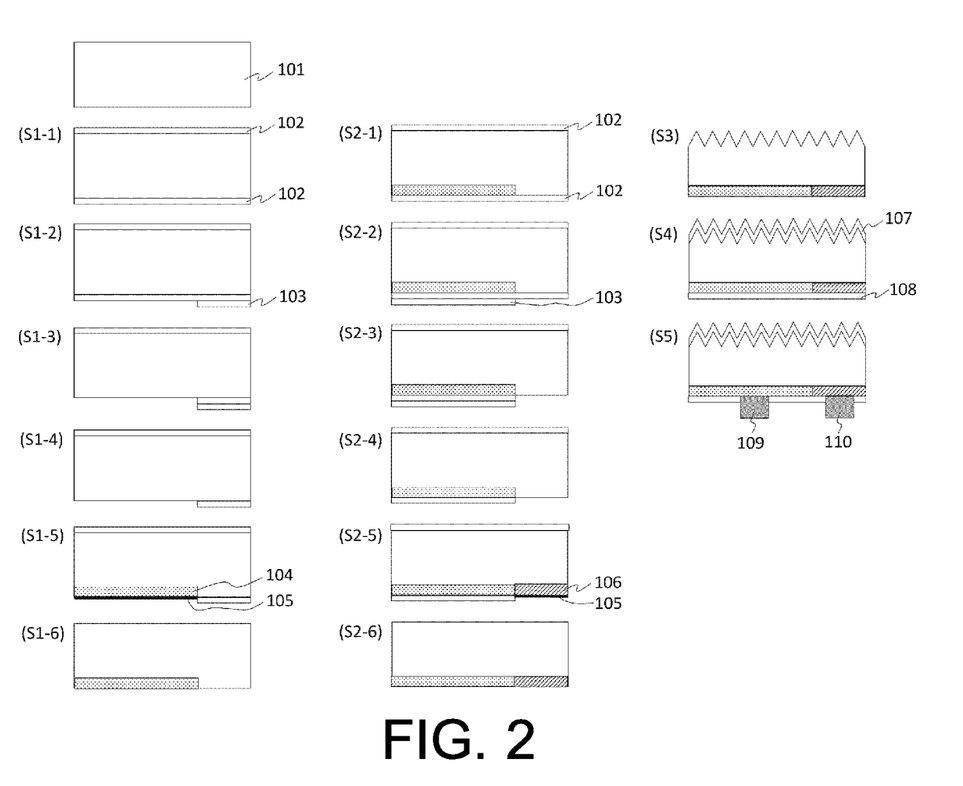
FIG. 2 is a flowchart that illustrates a method for manufacturing the high efficiency back contact type solar cell.

FIG. 2 illustrates a method for manufacturing the high efficiency back contact type solar cell 200 of the present invention. Prior to the manufacturing, the semiconductor substrate 101 is soaked into an acid solution or the like for damage etching, to remove damage on the surface caused by slicing or the like, and the semiconductor substrate 101 is then cleaned and dried.

First of all, the emitter layer 104 is formed on the back surface of the semiconductor substrate 101 after the damage etching (S1). The protective layer 102 such as a silicon oxide layer is first formed on the entire surface of the semiconductor substrate 101 (S1-1). A silicon oxide layer with a layer thickness of approximately 30 to 300 nm is formed by, for example, a thermal oxidation method in which the semiconductor substrate 101 is set in an oxygen atmosphere at a high temperature of 800 to 1100° C. for a short period of time. Subsequently, by screen printing, resist paste is applied to the region of the protective layer 102 other than regions for forming the emitter layer 104 on the back surface of the semiconductor substrate 101, and the resist paste is cured (S1-2). The semiconductor substrate 101 is then soaked into a hydrofluoric acid aqueous solution to remove the protective layer 102 covering the region for forming the emitter layer 104 (S1-3), and is further soaked into acetone or the like to remove the resist paste 103 (S1-4). Then, p-type impurities are diffused by, for example, the thermal diffusion method in the region where the protective layer 102 has been removed, to form the emitter layer 104 as a p-type diffusion layer and a glass layer 105 (S1-5). Specifically, for example by placing this semiconductor substrate 101 in a high temperature gas at 800 to 1100° C. containing BBr$_3$, boron is diffused in the regions not formed with the protective layer 102, to form the glass layer 105 and the emitter layer 104 with sheet resistance of approximately 20 to 300Ω/☐. The semiconductor substrate 101 is then soaked into a chemical such as a diluted hydrofluoric acid solution to remove the remaining protective layer 102 and the glass layer 105, and is cleaned by deionized water (S1-6). This leads to formation of the emitter layer 104 where p-type impurities are diffused in a desired region on the back surface of the semiconductor substrate 101.

Subsequently, the BSF layer 106 is formed in the region not formed with the emitter layer 104 on the back surface of the semiconductor substrate 101 (S2). First, the protective layer 102 such as a silicon oxide layer is formed on the entire surface of the semiconductor substrate 101 (S2-1). A silicon oxide layer is formed by, for example, a thermal oxidation method in which the semiconductor substrate 101 is set in an oxygen atmosphere at a high temperature of 800 to 1100° C. At this time, the time for placement at the high temperature is made longer, to form the silicon oxide layer, and simultaneously allow boron, diffused in the vicinity of the surface of the semiconductor substrate 101 at the time of forming the emitter layer 104, to be diffused more deeply in the semiconductor substrate 101 and also diffused in the formed silicon oxide layer. As a result, a surface concentration of boron forming the emitter layer 104 decreases, and the sheet resistance changes accordingly. The diffusion depth, the surface concentration, and the sheet resistance can be appropriately adjusted by changing thermal oxidation conditions.

Subsequently, by screen printing, resist paste is applied to a region of the protective layer 102 which covers the region formed with the emitter layer 104 on the back surface of the semiconductor substrate 101, and the resist paste is cured (S2-2). The semiconductor substrate 101 is then soaked into a hydrofluoric acid aqueous solution to remove the protective layer 102 covering the region not formed with the emitter layer 104 (S2-3), and is further soaked into acetone or the like to remove the resist paste 103 (S2-4). Then, n-type impurity elements are diffused by, for example, the thermal diffusion method in the region where the protective layer 102 has been removed, to form the BSF layer 106 as the n-type diffusion layer and the glass layer 105 (S2-5). Specifically, for example by setting this semiconductor substrate 101 in a high temperature gas at 850 to 1100° C. containing $POCl_3$, phosphorus is diffused in the region not formed with the protective layer 102, to form the glass layer 105 and the BSF layer 106 with sheet resistance of approximately 30 to 300Ω/□. The semiconductor substrate 101 is then soaked into a chemical such as a diluted hydrofluoric acid solution to remove the remaining protective layer 102 and the glass layer 105, and is cleaned by deionized water (S2-6). This leads to formation of the BSF layer 106 where n-type impurities are diffused in the region not formed with the emitter layer 104 on the back surface of the semiconductor substrate 101.

Next, a concave-convex structure, which is called a texture, is formed on the light receiving surface of the semiconductor substrate 101 (S3). The texture can be formed by soaking the semiconductor substrate 101 in an acid or alkaline solution for a certain period of time. For example, the texture can be formed by applying resist paste to the entire back surface of the semiconductor substrate 101 by screen printing, curing the resist paste, and then chemically etching the back surface by use of a potassium hydroxide aqueous solution or the like, followed by cleaning and drying. By forming the texture, incident light from the light receiving surface multiply reflects to be confined in the semiconductor substrate 101, thereby enabling effectively reduction in reflectance and improvement in conversion efficiency. Thereafter, the semiconductor substrate 101 is soaked into acetone or the like to remove the resist paste applied to the entire back surface of the semiconductor substrate 101. Note that the texture may be formed before formation of the emitter layer 104 and the BSF layer 106. The texture may also be formed on the back surface of the semiconductor substrate 101. In addition, an FSF (Front Surface Field) layer may further be formed on the light receiving surface of the semiconductor substrate 101.

Subsequently, the antireflection films with passivation properties 107, 108 made of SiN (silicon nitride) or the like are respectively formed on both surfaces of the semiconductor substrate 101 (S4). In the case of the silicon nitride layer, it is formed by, for example, a plasma CVD method where a mixed gas of $SiH_4$ and $NH_3$ is diluted by $N_2$ and plasma-gasified by glow discharge decomposition, or by some other method. Each of the antireflection films with passivation properties 107, 108 is formed such that a refractive index is approximately 1.8 to 2.3 and the thickness is approximately 50 to 100 nm in view of a difference in refractive index from the semiconductor substrate 101. This film performs the function of preventing the reflection of light on the front surface of the semiconductor substrate 101 and effectively absorbing the light in the semiconductor substrate 101, and also functions as a passivation layer having a passivation effect on the n-type diffusion layer, to exert the effect of improving electric characteristics of the solar cell. Note that the antireflection films with passivation properties 107, 108 may be a single-layered film of silicon oxide, silicon carbide, amorphous silicon, aluminum oxide, titanium oxide, or the like, or a laminated film formed by combining these. Different films may be used for the light receiving surface and the back surface of the semiconductor substrate 101.

Subsequently, the electrodes 109, 110 are formed (S5). The electrode may be formed by, for example, providing openings in the antireflection films with passivation properties 108 by etching paste or the like and performing sputtering, or may be formed by the screen printing method. In the case of using the screen printing method, first, conductive paste containing, for example, a silver powder, glass frit, an aluminum powder, or vanish is screen-printed on each of a regions of the antireflection film with passivation property 108 where the electrode 109 in contact with the emitter layer 104 is to be formed and regions thereof where the electrode 110 in contact with the BSF layer 106 are to be formed, and the conductive paste is then dried. At this time, a mesh roughness, an emulsion thickness, an opening size, and the like of a screening mask, which is used in screen printing, are changed to allow appropriate adjustment of the width and the cross-sectional area of the electrode.

The conductive paste printed as above is fired at approximately 500° C. to 950° C. for approximately 1 to 60 seconds to penetrate through the antireflection film with passivation property 108 (firing through). Thereby, a sintered body containing silver, glass flit, and aluminum is electrically connected with the emitter layer 104 or the BSF layer 106 to be formed into the electrodes 109, 110. Note that the firing at the time of forming the electrode may be performed once or may be separately performed more than once. Further, the conductive paste to be applied onto the emitter layer 104 and the conductive paste to be applied onto the BSF layer 106 may be different.

<Consideration of Problem Solving Means>

By the above manufacturing method, a plurality of samples for measuring a reverse saturation current density of the emitter layer were produced while changing the thermal oxidation conditions. Note that the electrode was not formed since the electrode is unnecessary in measuring the reverse saturation current density. A specific resistance of the n-type semiconductor substrate used for the production is 1 ω·cm, a doping concentration of phosphorus is about $5 \times 10^{15}$ atoms/cm$^3$, and the antireflection films with passivation properties are a silicon nitride layer having a thickness of 100 nm and formed by the plasma CVD method using SiH$_4$ and NH$_3$, and N$_2$.

Figure 3:
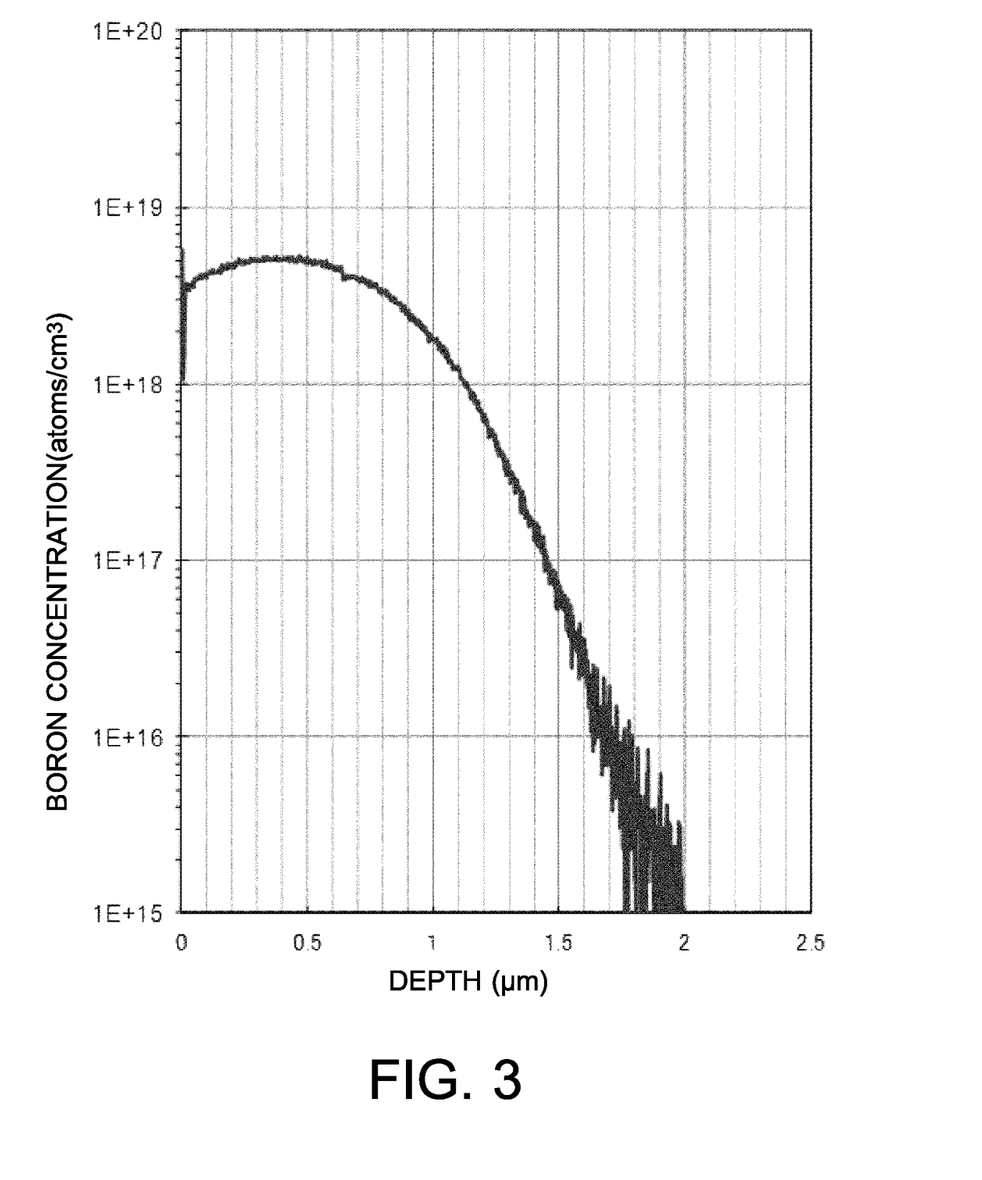
FIG. 3 is a graph that illustrates one example of a relation between a depth from a substrate surface and an impurity concentration at that depth.

In each sample, a diffusion profile of boron into the emitter layer was measured by SIMS (equipment used was "ims-4f" manufactured by CAMECA SAS., primary ion was O$_2$$^+$, primary ion energy was 10.5 keV, a scanning region was 200×200 μm, a detected region was 104 μmφ, secondary ion polarity was positive). FIG. 3 is a graph that illustrates a relation between a depth from the substrate surface and a concentration of boron being impurities at that depth, obtained as a measurement result of a certain sample. As viewed from FIG. 3, a sudden extreme fluctuation of the concentration is recognized around a depth of 0 to 0.02 μm in the vicinity of the outermost surface. This concentration fluctuation is considered as variation in measured value influenced by a foreign matter on the substrate surface, the unevenness of the substrate surface, or the like, and includes a number of errors. Accordingly, the surface concentration is defined as a concentration around 0.03 μm in the following. In case that such definition was made, the surface concentrations of the respective produced samples were $1 \times 10^{17}$ to $1 \times 10^{20}$ atoms/cm$^3$. Further, the diffusion depth is defined hereinafter as a depth at which a concentration of diffused boron obtained by the SIMS measurement becomes equal to a concentration of phosphorus doped into the n-type semiconductor substrate. In case that such definition was made, the diffusion depths of the respective produced samples were 0.7 to 3.5 μm.

Figure 4A:
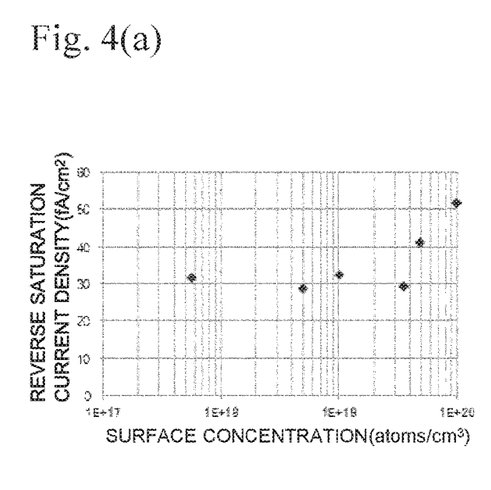
FIGS. 4(a) and 4(b) are graphs that plot reverse saturation current densities of the respective samples versus a surface concentration and sheet resistance, respectively.
Figure 4B:
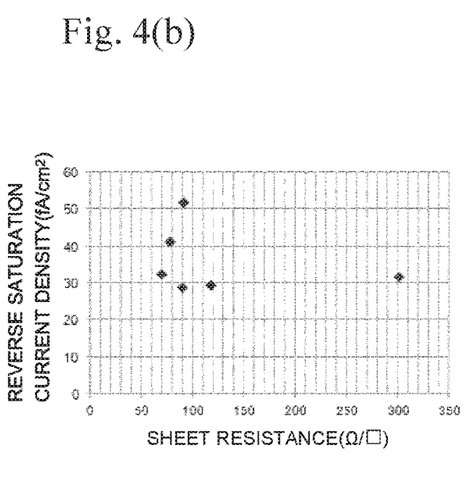

After measurement of the diffusion profile, reverse saturation current densities of the respective samples for measuring a reverse saturation current density were measured by the QSSPC method (equipment used was WCT-100, manufactured by Sinton Consulting Inc.). FIGS. 4 (a) and 4 (b) are graphs that plot the reverse saturation current densities of the respective samples, obtained by QSSPC, versus the surface concentration and the sheet resistance, respectively. FIG. 4 (a) is a graph that plots the current densities versus the surface concentration, and FIG. 4 (b) is a graph that plots the current densities versus the sheet resistance. From FIGS. 4 (a) and 4 (b), the reverse saturation current density is recognized as having a tendency to become lower with decrease in surface concentration, whereas it is found to have no correlation with the sheet resistance. That is, it can be said that lowering the surface concentration allows an increase in open voltage, and thereby allows enhancement of the conversion efficiency.

Figure 5A:
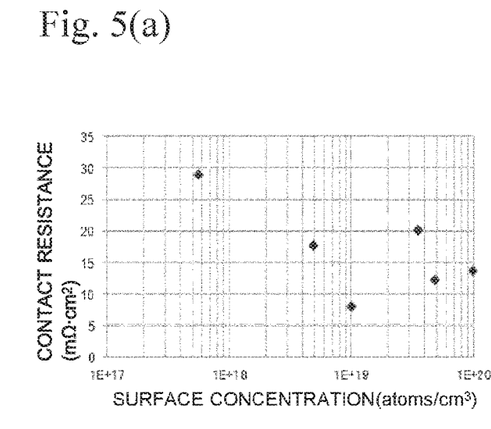
FIGS. 5(a) and 5(b) are graphs that plot contact resistances of the respective samples versus the surface concentration and the sheet resistance, respectively.
Figure 5B:
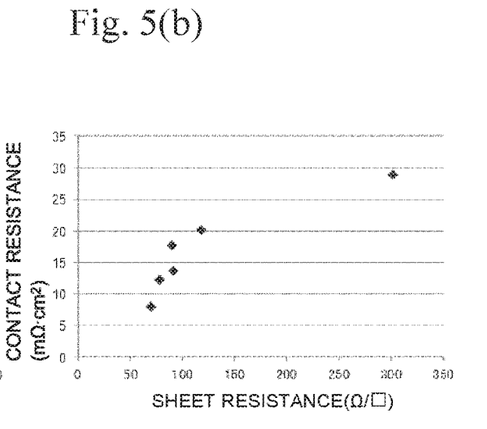

Next, conductive paste was applied to each of the samples for measuring a reverse saturation current density in a pattern based on the TLM method, and fired at 800° C. for ten seconds to produce a plurality of samples for measuring contact resistance. The TLM method is widely known as a method for accurately measuring contact resistance of a contact in a mode where a current incident vertically on the contact surface turns and flows horizontally on the device surface. FIGS. 5 (a) and 5 (b) are graphs that plot contact resistances of the respective samples, measured by the TLM method, versus the sheet resistance and the surface concentration, respectively. From FIGS. 5(a) and 5 (b), the contact resistance is recognized as having a positive correlation with the sheet resistance, whereas it is found to have no correlation with the surface concentration.

From the above, in order to achieve an emitter layer with both reverse saturation current density and contact resistance being low, it is only necessary to form an emitter layer with a low surface concentration and low sheet resistance. This condition can be easily satisfied by forming an emitter layer with a low surface concentration and a large diffusion depth. This is because, although the sheet resistance typically increases when the surface concentration decreases, that increase can be reduced by increasing the diffusion depth.

Figure 6:
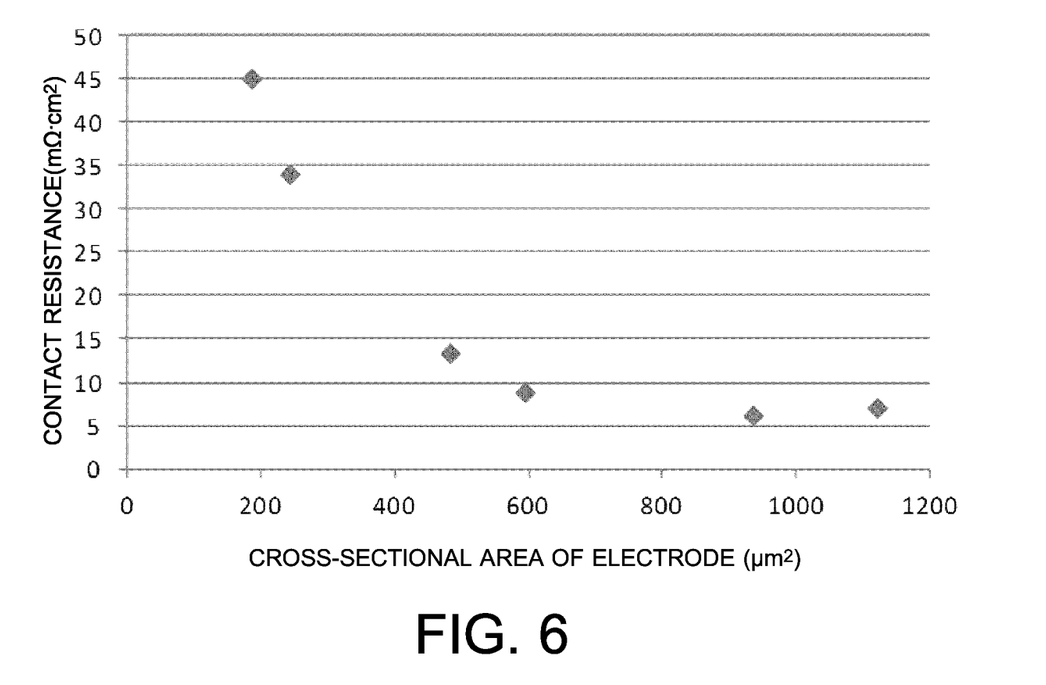
FIG. 6 is a graph that illustrates a relation between a cross-sectional area of the electrode and the contact resistance in each sample.

Next, among the samples for measuring contact resistance, samples with sheet resistance of 70Ω/□ were formed by setting a width of a finger electrode connected with the emitter layer to a fixed value (60 μm) and changing a cross-sectional area of the finger electrode, and the contact resistance was measured. In this case, the cross-sectional area of the electrode was measured using a laser microscope VK-8500, manufactured by KEYENCE CORPORATION, and the contact resistance was measured using the TLM method. The cross-sectional area was changed by changing a thickness of a gauze for a screen printing plate and a thickness of an emulsion. The contact resistance of the electrode as thus measured was plotted versus the cross-sectional area (FIG. 6). It is found from FIG. 6 that, even though the contact area of the electrode is fixed, when the cross-sectional area decreases, the contact resistance increases, and the conversion efficiency deteriorates. It can thus be said that the cross-sectional area of the electrode is preferably made large in a range permitted by cost.

As one of reasons why the contact resistance becomes smaller when the cross-sectional area of the electrode is larger, the following circumstance can be cited.

When the conductive paste was fired to form the electrode, a place was recognized where the electrode penetrated into the substrate to a depth of approximately 2 μm at the maximum. In this context, the penetration depth was measured by soaking the electrode into hydrofluoric acid and nitric acid to remove the electrode from the substrate, and observing a mark of the removal left on the substrate by SEM. In confirming the relation between the penetration depth and the contact resistance of the electrode as to a plurality of samples, it was found that in the electrode having large contact resistance with the emitter layer, there is almost no penetrating and connected place, or even if there is such a place in rare cases, the penetration is shallow, but in the electrode having small contact resistance with the emitter layer, there is a large penetrating and connected area, and the penetration is deep. That is, it is considered that the deeper the electrode penetrates, the smaller the contact resistance, and it is considered therefrom that the contact resistance depends not only on the dopant concentration of the surface, but also on a depthwise change in dopant concentration. Specifically, it is considered that the contact resistance can be reduced more by the electrode penetrating to such a depth as to roughly cover a range in which the impurities are diffused with a high concentration.

However, when the cross-sectional area of the electrode is small at this time, absolute amounts of materials such as glass frit, aluminum, and the like which constitute the electrode and assist electric connection with the emitter layer, become insufficient, leading to an increase in contact resistance. It can thus be said that in order to avoid the increase in contact resistance and obtain a stable yield, the cross-sectional area of the electrode is preferably made large in a range permitted by cost, while the electrode is made to penetrate into the emitter layer to a certain extent.

EXAMPLES

The correctness of the problem solving means specified by the above consideration was verified using a plurality of products manufactured by making the impurity diffusion profile and the electrode shape different. Manufacturing methods and verification results of the respective samples are shown below.

<First Common Step>

An n-type silicon substrate, doped with phosphorus and produced by slicing to have a thickness of 0.2 mm, and made of n-type single-crystalline silicon with a resistivity of about 1 Ω·cm and a doping concentration of about $5 \times 10^{15}$ atms/cm$^3$, was prepared, and subjected to outside diameter processing, to be formed into a square plate shape with a side length of 15 cm. This substrate was soaked in a fluonitric acid solution for 15 seconds to be subjected to damage etching, and thereafter cleaned with deionized water and dried.

The n-type silicon substrate after the damage etching was set in an oxygen atmosphere and thermally oxidized at a temperature of 1000° C. for 45 minutes, to form a silicon oxide layer on each surface of the substrate with a thickness of 50 nm. Then, the resist paste was screen-printed on a region at which the BSF layer was to be formed of the silicon oxide layer formed on the back surface of the substrate, and heated at a temperature of 100° C. to be dried. In this context, with the emitter layer having a width of 800 μm and the BSF layer having a width of 200 μm, a screen printing plate was formed in such a pattern as to have a structure of an interdigitated back contact cell where the emitter layers and the BSF layers were alternately formed. As the resist paste, Paste 185 manufactured by Lektrachem Ltd. was used. The substrate was soaked into a 2% hydrofluoric acid aqueous solution to partially remove the silicon oxide layer while leaving the layer on the region at which the BSF layer was to be formed, and then soaked into acetone to remove the resist paste, and thereafter, the substrate was cleaned with deionized water and dried. Next, thermal diffusion treatment was performed on the back surface of the substrate in a BBr$_3$ gas atmosphere at a temperature of 900° C. for 20 minutes, to form a p-type diffusion layer as the emitter layer and a glass layer on the back surface of the substrate. The formed p-type diffusion layer had a sheet resistance of about 70Ω/□ and a diffusion depth of 0.5 μm. Thereafter, this substrate was soaked into a 25% hydrofluoric acid aqueous solution, and then cleaned with deionized water and dried to remove the silicon oxide layer and the glass layer.

Comparative Example 1

Comparative Example 1 is the case of adopting a method for manufacturing a conventional product where it takes a short period of time (45 minutes) to perform thermal oxidation in the step of forming the protective layer (silicon oxide layer) which is performed after formation of the emitter layer. Specifically, after performing the following step, second and third common steps described later are performed to manufacture a back contact type solar cell.

The substrate formed with the emitter layer as described above was set in an oxygen atmosphere and thermally oxidized at a temperature of 1000° C. for 45 minutes, to form a silicon oxide layer on each surface of the substrate with a thickness of 50 nm. By the thermal treatment at this time, boron diffused in the emitter layer was re-diffused. A diffusion profile of boron in the emitter layer after the re-diffusion was measured by SIMS (equipment used was "ims-4f" manufactured by CAMECA SAS., primary ion was O$_2^+$, primary ion energy was 10.5 keV, a scanning region was 200×200 μm, a detected region was 104 μmφ, secondary ion polarity was positive). As a result, the surface concentration was $1.0 \times 10^{20}$ atms/cm$^3$, the maximum concentration was $1.4 \times 10^{20}$ atms/cm$^3$, the depth at which the maximum concentration was obtained was 0.07 μm, and the diffusion depth was 0.5 μm. The sheet resistance of the emitter layer was about 50 Ω/□.

Example 1

Example 1 is the case of extending the thermal oxidation time to 90 minutes in Comparative Example 1.

The substrate formed with the emitter layer as described above was set in an oxygen atmosphere and thermally oxidized at a temperature of 1000° C. for 90 minutes, to form a silicon oxide layer on each surface of the substrate with a thickness of 80 nm. By the thermal treatment at this time, boron diffused in the emitter layer was re-diffused. The diffusion profile of boron in the emitter layer after the re-diffusion was measured by SIMS, resulting in that the surface concentration was $5.0 \times 10^{19}$ atms/cm$^3$, the maximum concentration was $7 \times 10^{19}$ atms/cm$^3$, the depth at which the maximum concentration was obtained was 0.1 μm, and the diffusion depth was 1.0 μm. The sheet resistance of the emitter layer was about 60 Ω/□.

Example 2

Example 2 is the case of extending the thermal oxidation time to 120 minutes in Comparative Example 1.

The substrate formed with the emitter layer as described above was set in an oxygen atmosphere and thermally oxidized at a temperature of 1000° C. for 120 minutes, to form a silicon oxide layer on each surface of the substrate with a thickness of 100 nm. By the thermal treatment at this time, boron diffused in the emitter layer was re-diffused. The diffusion profile of boron in the emitter layer after the re-diffusion was measured by SIMS, resulting in that the surface concentration was $1.0 \times 10^{19}$ atms/cm$^3$, the maximum concentration was $1.2 \times 10^{19}$ atms/cm$^3$, the depth at which the maximum concentration was obtained was 0.4 μm, and the diffusion depth was 2.0 μm. The sheet resistance of the emitter layer was about 70 Ω/□.

Example 3

Example 3 is the case of extending the thermal oxidation time to 180 minutes in Comparative Example 1.

The substrate formed with the emitter layer as described above was set in an oxygen atmosphere and thermally oxidized at a temperature of 1000° C. for 180 minutes, to form a silicon oxide layer on each surface of the substrate with a thickness of 130 nm. By the thermal treatment at this time, boron diffused in the emitter layer was re-diffused. The diffusion profile of boron in the emitter layer after the re-diffusion was measured by SIMS, resulting in that the surface concentration was $5.0 \times 10^{18}$ atms/cm$^3$, the maximum concentration was $8.0 \times 10^{18}$ atms/cm$^3$, the depth at which the maximum concentration was obtained was 0.7 μm, and the diffusion depth was 2.3 μm. The sheet resistance of the emitter layer was about 90 Ω/□.

Example 4

Example 4 is the case of extending the thermal oxidation time to 240 minutes in Comparative Example 1.

The substrate formed with the emitter layer as described above was set in an oxygen atmosphere and thermally oxidized at a temperature of 1000° C. for 240 minutes, to form a silicon oxide layer on each surface of the substrate with a thickness of 150 nm. By the thermal treatment at this time, boron diffused in the emitter layer was re-diffused. The diffusion profile of boron in the emitter layer after the re-diffusion was measured by SIMS, resulting in that the surface concentration was $5.0 \times 10^{17}$ atms/cm$^3$, the maximum concentration was $7.0 \times 10^{17}$ atms/cm$^3$, the depth at which the maximum concentration was obtained was 1.0 µm, and the diffusion depth was 2.9 µm. The sheet resistance of the emitter layer was about 280 Ω/□.

Comparative Example 2

Comparative Example 2 is the case of extending the thermal oxidation time to 300 minutes in Comparative Example 1.

The substrate formed with the emitter layer as described above was set in an oxygen atmosphere and thermally oxidized at a temperature of 1000° C. for 300 minutes, to form a silicon oxide layer on each surface of the substrate with a thickness of 160 nm. By the thermal treatment at this time, boron diffused in the emitter layer was re-diffused. The diffusion profile of boron in the emitter layer after the re-diffusion was measured by SIMS, resulting in that the surface concentration was $3.0 \times 10^{17}$ atms/cm$^3$, the maximum concentration was $5.0 \times 10^{17}$ atms/cm$^3$, the depth at which the maximum concentration was obtained was 1.1 µm, and the diffusion depth was 3.3 µm. The sheet resistance of the emitter layer was about 320 Ω/□.

<Second Common Step>

The resist paste was screen-printed on the emitter layer formed place of the silicon oxide layer formed in the steps of Comparative Example 1 or 2, or Examples 1, 2, 3, or 4, and heated at a temperature of 100° C. to be dried. In this context, as the resist paste, Paste 185 manufactured by Lektrachem Ltd. was used. The substrate printed with the resist paste was soaked into a 2% hydrofluoric acid aqueous solution to remove the silicon oxide layer other than the emitter layer formed place (a place for forming the BSF layer), and thereafter soaked into acetone to remove the resist paste.

Subsequently, on the back surface of each of the substrate, from which the silicon oxide layer had been partially removed, the thermal diffusion treatment was performed in a POCl$_3$-gas atmosphere at a temperature of 930° C. for 20 minutes, to diffuse phosphorus in the place where the silicon oxide layer had been removed and form a glass layer and an n-type diffusion layer as the BSF layer. The formed n-type diffusion layer had a sheet resistance of about 30Ω/□ and a diffusion depth of 0.5 µm. Thereafter, these substrates were soaked into a 25% hydrofluoric acid aqueous solution, and then cleaned with deionized water and dried to remove the silicon oxide layer and the glass layer.

Then, the resist paste was screen-printed on the entire back surface of the substrate, and heated at a temperature of 100° C. to be dried. In this context, as the resist paste, Paste 185 manufactured by Lektrachem Ltd. was used. The substrate was chemically etched by use of a solution containing 2% of potassium hydroxide and 2% of IPA at 70° C. for five minutes, and then cleaned with deionized water and dried to form a texture structure on the light receiving surface of the substrate. Thereafter, the substrate was soaked into acetone to remove the resist paste.

Subsequently, by the plasma CVD method using SiH$_4$, NH$_3$, and N$_2$, silicon nitride layers as the antireflection films with passivation properties were formed having a thickness of 100 nm on both surfaces of the substrate.

<Third Common Step>

The conductive silver paste was printed on the emitter layer of the substrate, subjected to the above treatment so far, by the screen printing method and then dried at 150° C. As the conductive silver paste, SOL9383M manufactured by Heraeus Holding was used. Further, the conductive silver paste was printed on the BSF layer of the substrate by the screen printing method using a plate that has 325 mesh, an emulsion thickness of 20 µm, and a linear opening with a width of 50 µm, and the paste was then dried at 150° C. The printed conductive silver paste was fired at the maximum temperature of 800° C. for five seconds to form an electrode, and produce the back contact type solar cell according to each of the comparative examples and examples.

<Implementation Result 1>

Table 1 shows an average conversion efficiency, an average short circuit current density, an average open voltage, and an average fill factor of each 100 back contact type solar cells produced through steps of Comparative Example 1 or 2, or Examples 1, 2, 3, or 4.

TABLE 1

| | Impurity surface concentration (atms/cm$^3$) | Diffusion depth (µm) | Sheet resistance (Ω/□) | Average conversion efficiency (%) | Average short circuit current density (mA/cm$^2$) | Average open voltage (V) | Average fill factor (%) |
|---|---|---|---|---|---|---|---|
| Comparative example 1 | $1 \times 10^{20}$ | 0.5 | 50 | 19.0 | 38.1 | 0.641 | 77.9 |
| Example 1 | $5 \times 10^{19}$ | 1.0 | 60 | 19.5 | 38.5 | 0.646 | 78.3 |
| Example 2 | $1 \times 10^{19}$ | 2.0 | 70 | 19.5 | 38.5 | 0.648 | 78.1 |
| Example 3 | $5 \times 10^{18}$ | 2.3 | 90 | 19.4 | 38.4 | 0.651 | 77.7 |
| Example 4 | $5 \times 10^{17}$ | 2.9 | 280 | 19.2 | 38.5 | 0.651 | 76.8 |
| Comparative example 2 | $3 \times 10^{17}$ | 3.3 | 320 | 19.0 | 38.3 | 0.649 | 76.4 |

Setting the surface concentration of the impurities in the emitter layer to not higher than $5 \times 10^{19}$ atms/cm$^3$ (Examples 1 to 4) enabled enhancement of the conversion efficiency as compared with the case of the conventional product having a high surface concentration (Comparative Example 1). This is considered to be because the reverse saturation current density decreases and the open voltage increases due to the decrease in surface concentration of the impurities. A short-circuit current also increases at this time, and this is considered to be influenced by an increase in lifetime of the substrate with progress of gettering of the metal impurities into the diffusion layer due to extension of the oxidation time. However, when the surface concentration is made excessively low as in Comparative Example 2, lateral flow resistance of the emitter layer becomes large to prevent sufficient enhancement of the conversion efficiency. For this reason, the upper limit of the surface concentration is preferably set to $5\times10^{19}$ atms/cm$^3$ which is lower than the surface concentration of the conventional product shown in Comparative Example 1, and the lower limit thereof is preferably set to $5\times10^{17}$ atms/cm$^3$. Further, from the results of Examples 1 to 4, the lower limit of the diffusion depth is preferably set to not smaller than 1 μm which is larger than the diffusion depth of the conventional product shown in Comparative Example 1, and the upper limit thereof is preferably set to not larger than 2.9 μm. Moreover, from the results of Examples 1 to 4, the lower limit of the sheet resistance is preferably set to 60Ω/□, and the upper limit thereof is preferably set to 280Ω/□. However, when the upper limit is set to larger than 150Ω/□, variation in sheet resistance becomes very large at the time of mass-production to make the control difficult, and hence the upper limit is more preferably set to 150 Ω/□.

Next, an influence exerted on the conversion efficiency by a change in shape of the electrode for making the contact resistance small is verified.

Comparative Example 3

The conductive silver paste was printed by the screen printing method on the BSF layer of the substrate subjected to the processing in Example 2 and the second common step, and the paste was then dried at 150° C. As the conductive silver paste, SOL9412 manufactured by Heraeus Holding was used. Main solid components of SOL9412 are silver and glass frit, and an aluminum powder is not added thereto.

Further, the conductive silver paste was printed on the emitter layer of the substrate by the screen printing method using a plate that has 360 mesh, an emulsion thickness of 10 μm, and a linear opening with a width of 60 μm, and the paste was then dried at 150° C. Thereafter, the substrate printed with the conductive silver paste was fired at the maximum temperature of 800° C. for five seconds to form an electrode. The electrode after formed had a width of about 70 μm, a thickness of about 8 μm, and a cross-sectional area of about 250 μm$^2$. The electrode on the semiconductor substrate as thus formed was removed by hydrofluoric acid and nitric acid, and the penetration depth into the diffusion layer was measured by SEM, to recognize no penetrating place.

Comparative Example 4

Comparative Example 4 is the case of applying, as the conductive silver paste, one added with the aluminum powder in Comparative Example 3.

The conductive silver paste was printed by the screen printing method on the BSF layer of the substrate subjected to the processing in Example 2 and the second common step, and the paste was then dried at 150° C. As the conductive silver paste, SOL9383M manufactured by Heraeus Holding was used. Main solid components of SOL9383M are silver, the glass frit, and the aluminum powder.

Further, the conductive silver paste was printed on the emitter layer of the substrate by the screen printing method using a plate that has 360 mesh, an emulsion thickness of 10 μm, and a linear opening with a width of 60 μm, and the paste was then dried at 150° C. Thereafter, the substrate printed with the conductive silver paste was fired at the maximum temperature of 800° C. for five seconds to form an electrode. The electrode after formed had a width of about 70 μm, a thickness of about 8 μm, and a cross-sectional area of about 250 μm$^2$. The electrode on the semiconductor substrate as thus formed was removed by hydrofluoric acid and nitric acid, and the penetration depth into the emitter layer was measured by SEM, to find that the maximum value of the penetration depth was 0.05 μm.

Example 5

Example 5 is the case of setting the mesh and the emulsion thickness, to be applied to the screen printing in Comparative Example 4, to 325 mesh and 20 μm, respectively.

The conductive silver paste was printed by the screen printing method on the BSF layer of the substrate subjected to the processing in Example 2 and the second common step, and the paste was then dried at 150° C. As the conductive silver paste, SOL9383M manufactured by Heraeus Holding was used.

Further, the conductive silver paste was printed on the emitter layer of the substrate by the screen printing method using a plate that has 325 mesh, an emulsion thickness of 20 μm, and a linear opening with a width of 60 μm, and the paste was then dried at 150° C. Thereafter, the substrate printed with the conductive silver paste was fired at the maximum temperature of 800° C. for five seconds to form an electrode. The electrode after formed had a width of about 70 μm, a thickness of about 12 μm, and a cross-sectional area of about 350 pmt. The electrode on the semiconductor substrate as thus formed was removed by hydrofluoric acid and nitric acid, and the penetration depth into the diffusion layer was measured by SEM, to find that the maximum value of the penetration depth was 0.1 μm.

Example 6

Example 6 is the case of setting the mesh and the emulsion thickness, to be applied to screen printing in Comparative Example 4, to 290 mesh and 30 μm, respectively.

The conductive silver paste was printed by the screen printing method on the BSF layer of the substrate subjected to the processing in Example 2 and the second common step, and the paste was then dried at 150° C. As the conductive silver paste, SOL9383M manufactured by Heraeus Holding was used.

Further, the conductive silver paste was printed on the emitter layer of the substrate by the screen printing method using a plate that has 290 mesh, an emulsion thickness of 30 μm, and a linear opening with a width of 60 μm, and the paste was then dried at 150° C. Thereafter, the substrate printed with the conductive silver paste was fired at the maximum temperature of 800° C. for five seconds to form an electrode. The electrode after formed had a width of about 70 μm, a thickness of about 15 μm, and a cross-sectional area of about 600 pmt. The electrode on the semiconductor substrate as thus formed was removed by hydrofluoric acid and nitric acid, and the penetration depth into the diffusion layer was measured by SEM, to find that the maximum value of the penetration depth was 0.9 μm.

Example 7

Example 7 is the case of setting the mesh and the emulsion thickness, to be applied to the screen printing in Comparative Example 4, to 250 mesh and 30 μm, respectively.

The conductive silver paste was printed by the screen printing method on the BSF layer of the substrate subjected to the processing in Example 2 and the second common step, and the paste was then dried at 150° C. As the conductive silver paste, SOL9383M manufactured by Heraeus Holding was used.

Further, the conductive silver paste was printed on the emitter layer of the substrate by the screen printing method using a plate that has 250 mesh, an emulsion thickness of 30 μm, and a linear opening with a width of 60 μm, and the paste was then dried at 150° C. Thereafter, the substrate printed with the conductive silver paste was fired at the maximum temperature of 800° C. for five seconds to form an electrode. The electrode after formed had a width of about 70 μm, a thickness of about 15 μm, and a cross-sectional area of about 950 pmt. The electrode on the semiconductor substrate as thus formed was removed by hydrofluoric acid and nitric acid, and the penetration depth into the diffusion layer was measured by SEM, to find that the maximum value of the penetration depth was 1.5 μm.

Example 8

Example 8 is the case of setting the mesh and the emulsion thickness, to be applied to the screen printing in Comparative Example 4, to 250 mesh and 40 μm, respectively.

The conductive silver paste was printed by the screen printing method on the BSF layer of the substrate subjected to the processing in Example 2 and the second common step, and the paste was then dried at 150° C. As the conductive silver paste, SOL9383M manufactured by Heraeus Holding was used.

Further, the conductive silver paste was printed on the emitter layer of the substrate by the screen printing method using a plate that has 250 mesh, an emulsion thickness of 40 μm, and a linear opening with a width of 60 μm, and the paste was then dried at 150° C. Thereafter, the substrate printed with the conductive silver paste was fired at the maximum temperature of 800° C. for five seconds to form an electrode. The electrode after formed had a width of about 70 μm, a thickness of about 15 μm, and a cross-sectional area of about 1050 pmt. The electrode on the semiconductor substrate as thus formed was removed by hydrofluoric acid and nitric acid, and the penetration depth into the diffusion layer was measured by SEM, to find that the maximum value of the penetration depth was 1.9 μm.

<Implementation Result 2>

Using the substrate subjected to the processing shown in Comparative Example 3 or 4, or Examples 5, 6, 7, or 8, each 100 back contact type solar cells according to each of the comparative examples and examples were produced, to measure an average conversion efficiency, an average short circuit current density, an average open voltage, and an average fill factor. Table 2 shows results of the measurement.

TABLE 2

| | A: Surface concentration<br>B: Maximum concentration<br>C: Maximum concentration depth<br>D: Diffusion depth<br>E: Sheet resistance | Contain conductive paste aluminum | Cross section of electrode (μm$^2$) | Penetration depth (μm) | Average conversion efficiency (%) | Average short circuit current density (mA/cm$^2$) | Average open voltage (V) | Average fill factor (%) |
|---|---|---|---|---|---|---|---|---|
| Comparative example 3 | A = 1 × 10$^{19}$ atms/cm$^3$<br>B = 1.2 × 10$^{19}$ atms/cm$^3$ | No | 250 | 0 | 13.3 | 37.5 | 0.638 | 55.7 |
| Comparative example 4 | C = 0.4 μm<br>D = 2.0 μm | Yes | 250 | 0.05 | 18.9 | 38.1 | 0.640 | 77.7 |
| Example 5 | E = 70 Ω/□ | Yes | 350 | 0.1 | 19.3 | 38.1 | 0.642 | 78.9 |
| Example 6 | | Yes | 600 | 0.9 | 19.4 | 38.1 | 0.641 | 79.4 |
| Example 7 | | Yes | 950 | 1.5 | 19.5 | 38.1 | 0.642 | 79.7 |
| Example 8 | | Yes | 1050 | 1.9 | 19.4 | 38.0 | 0.641 | 79.7 |

It is found from comparison between Comparative Example 3 and Comparative Example 4 that in order to penetrate the electrode into the emitter layer, it is preferable to add the aluminum powder to the conductive paste in addition to silver and the glass frit, to form a sintered body of these. Further, it is found that even a little penetration of the electrode into the emitter layer greatly improves the conversion efficiency.

From comparison between Comparative Example 4 and Examples 5 to 8, it is found that the conversion efficiencies in the examples are better. Especially, the conversion efficiencies in Examples 6 to 8 are excellent. This is because the electrode with a wide cross-sectional area penetrates deeply, exceeding the maximum concentration depth of the impurities, thereby making the contact resistance stable low and significant deterioration in fill factor hardly occur.

Even when the cross-sectional area of the electrode is set to not smaller than 1000 μm$^2$ as in Example 8, it does not lead to a significant increase in conversion efficiency as compared with the case when the cross-sectional area of the electrode was not larger than 1000 μm$^2$. Rather, it can be said that the upper limit of the cross-sectional area of the electrode is preferably set to approximately 1000 μm$^2$ considering a cost increase due to an increase in amount of the electrode used, the risk of the electrode penetrating through the emitter layer due to excessively large penetration depth to cause a decrease in parallel resistance, and further considering the tendency of the formed silver electrode to be peeled from the substrate due to excessive progress of sintering of the silver powder caused by the increase in cross-sectional area of the electrode.

For this reason, from the results of Examples 5 to 8, it is preferable to set the penetration depth to not smaller than 0.1 μm and not larger than 1.9 μm, and set the cross-sectional area to not smaller than 350 μm$^2$ and not larger than 1000 μm$^2$. The cross-sectional area of the electrode and the penetration depth can be appropriately adjusted by changing the mesh roughness and the emulsion thickness.

The above implementation result for Comparative Example 3 or 4, or Example 5, 6, 7, or 8 is a result concerning the case of forming the electrode on the substrate formed with the emitter layer by the method of Example 2, but a preferable penetration depth and a preferable cross-sectional area are similar even in the case of forming the electrode on the substrate formed with the emitter layer by the method of Example 1, 3, or 4. For this reason, in the light of the results of Examples 1 to 4, the maximum value of the concentration of the impurities in the emitter layer is preferably not lower than $7\times10^{17}$ atms/cm$^3$ and not higher than $7\times10^{19}$ atms/cm$^3$, and the maximum value of the depth is preferably set to not smaller than 0.1 μm and not larger than 1 μm from the top of the back surface of the substrate.

With such a configuration as above, it is possible to provide a high efficiency back contact type solar cell having favorable conversion efficiency and being manufacturable by a simple method with good yield at low cost.

Figure 7:
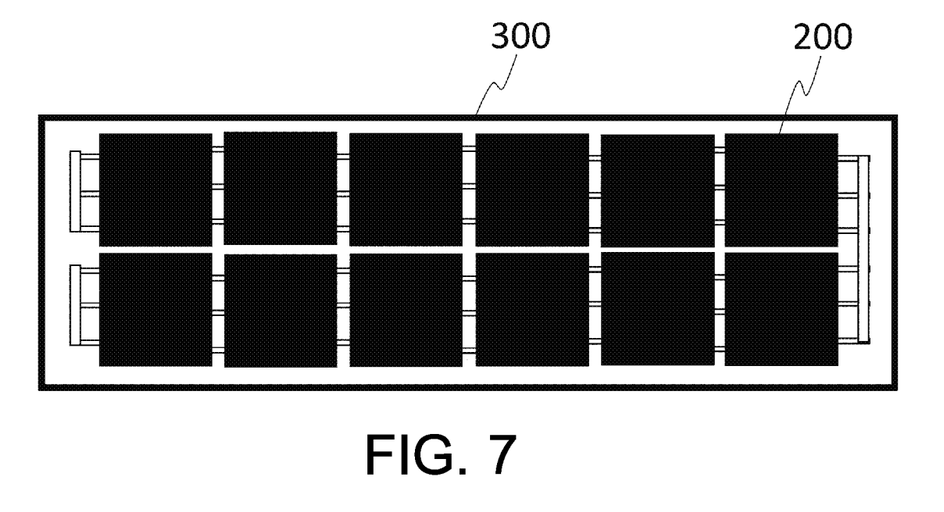
FIG. 7 is a schematic view that illustrates a configuration example of a solar cell module configured using the high efficiency back contact type solar cells of the present invention.
Figure 8:
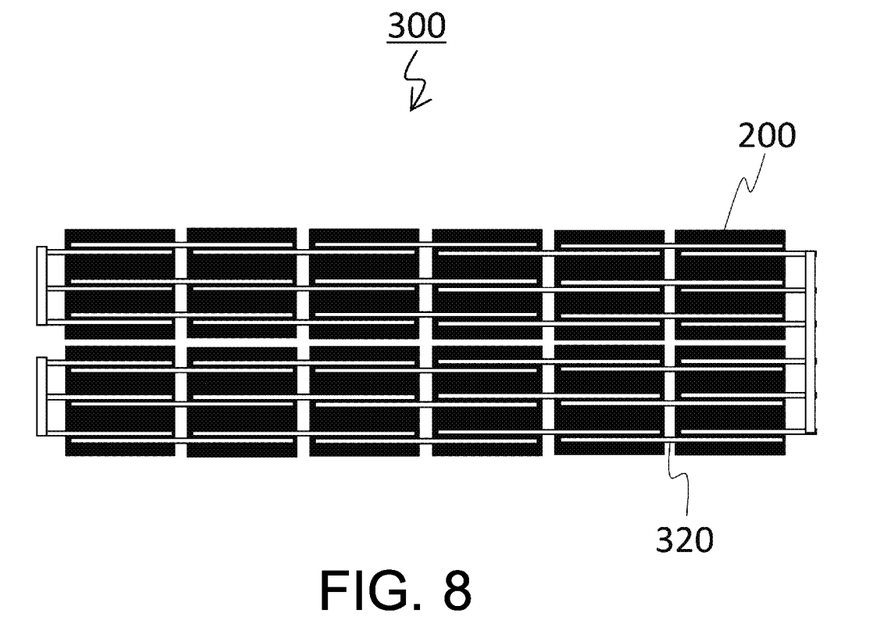
FIG. 8 is a schematic view that illustrates a configuration example of the back surface of the solar cell module illustrated in FIG. 7.
Figure 9:
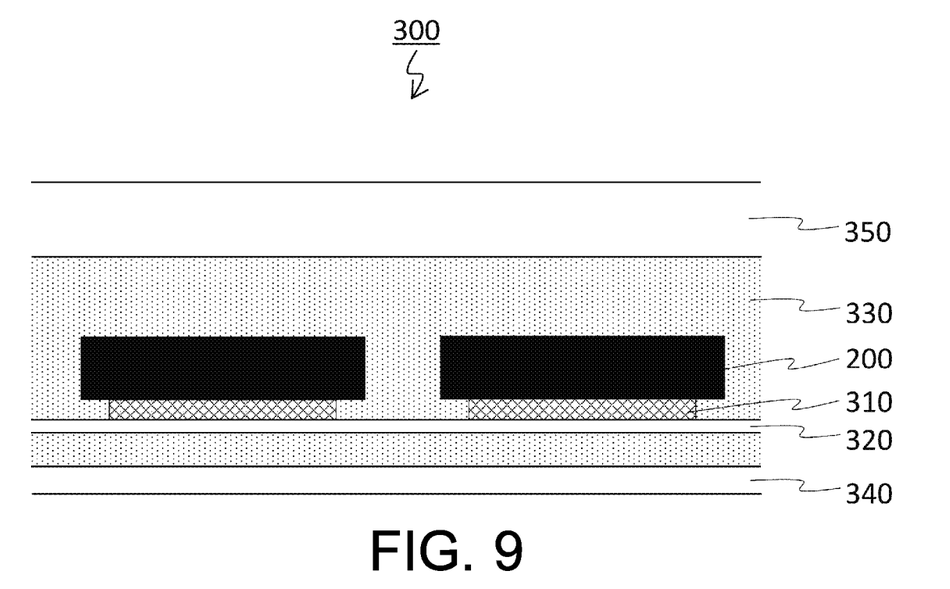
FIG. 9 is a schematic view that illustrates a configuration example of a cross section of the solar cell module illustrated in FIG. 7.

The high efficiency back contact type solar cell 200 produced in accordance with the above embodiment can be used for a solar cell module. FIG. 7 is a schematic view that illustrates a configuration example of a solar cell module 300. The solar cell module 300 has a structure where a plurality of high efficiency back contact type solar cells 200 are spread in the form of tiles. As for the plurality of high efficiency back contact type solar cells 200, each several to several tens of mutually adjacent cells are electrically connected in series to constitute a serial circuit called a string. FIG. 8 illustrates an overview of the string. FIG. 8 corresponds to a schematic view of the internal back surface side of the solar cell module 300 which is normally unseen. In FIG. 8, fingers and bus bars are omitted for the sake of clarifying the description. For constituting the serial circuit, a P bus bar and an N bus bar of the mutually adjacent high efficiency back contact type solar cells 200 are connected by lead wires 320. FIG. 9 illustrates a sectional schematic view of the solar cell module 300. As described above, the string is configured by connecting the plurality of high efficiency back contact type solar cells 200 by connection of the lead wire 320 to the bus bars 310. The string is sealed typically by a translucent filler 330 such as EVA (ethylene vinyl acetate), the non-light receiving surface (back surface) side is covered by a weatherproof resin film 340 such as PET (polyethylene terephthalate), and the light receiving surface is covered by a light receiving surface protecting material 350 having translucency and high mechanical strength, such as soda-lime glass. As the filler 330, polyolefin, silicone, or the like can be used other than EVA.

Figure 10:
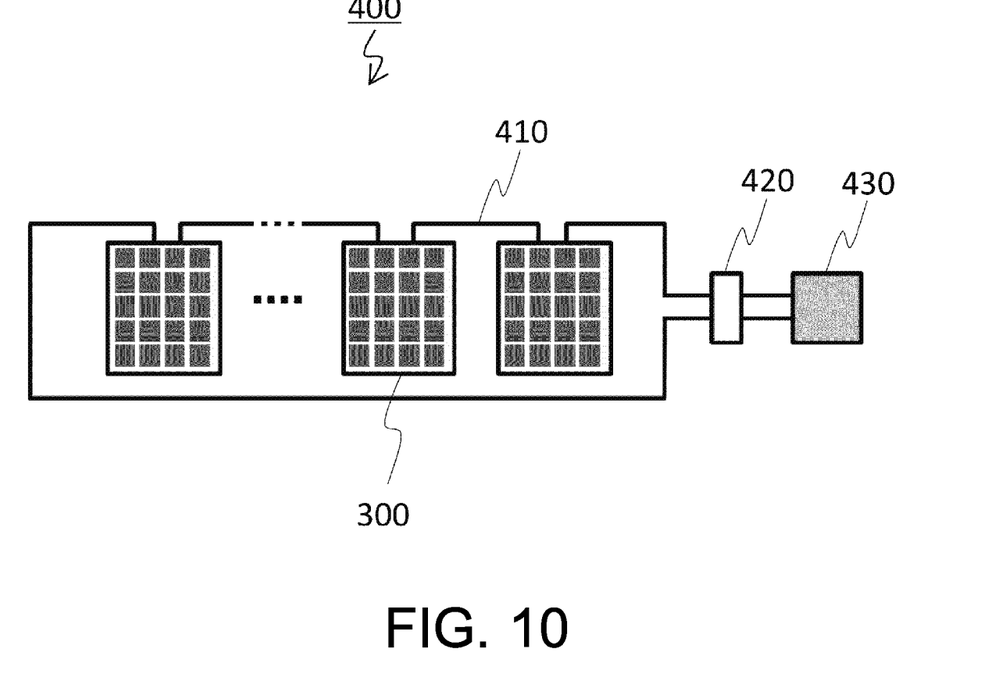
FIG. 10 is a schematic view that illustrates a configuration example of a photovoltaic power generation system configured using the solar cell module illustrated in FIG. 7.

A plurality of solar cell modules can be connected to constitute the photovoltaic power generation system. FIG. 10 is a schematic view that illustrates a configuration example of a photovoltaic power generation system 400 formed by coupling a plurality of solar cell modules 300 made up of a plurality of high efficiency back contact type solar cells 200 of the present invention. The photovoltaic power generation system 400 is formed by coupling a plurality of solar cell modules 300 in series by wiring 410 and supplies generated power to an external load circuit 430 through an inverter 420. Although not illustrated in FIG. 10, the photovoltaic power generation system 400 may further include a secondary battery for storing the generated power.

Note that the present invention is not restricted to the above embodiments and examples, and one which has substantially the same configuration as the technical idea recited in the claims and exerts a similar function effect thereto is included in the technical scope of the present invention even if any change has been made.

REFERENCE SIGNS LIST

100 Back contact type solar cell
101 Semiconductor substrate
102 Protective layer
103 Resist paste
104 Emitter layer
105 Glass layer
106 BSF layer
107, 108 Antireflection films with passivation properties
109, 110 Electrode
200 High efficiency back contact type solar cell
300 Solar cell module
310 Bus bar
320 Lead wire
330 Filler
340 Weatherproof resin film
350 Light receiving surface protecting material
400 Photovoltaic power generation system
410 Wiring
420 Inverter
430 External load circuit

The invention claimed is:

1. A back contact type solar cell, comprising:
a first conductive type semiconductor substrate;
an impurity diffusion layer where second conductive type impurities are diffused, the impurity diffusion layer being on a back surface, as a non-light receiving surface, of the first conductive type semiconductor substrate; and
an electrode in contact with the impurity diffusion layer, wherein
a surface concentration of the impurities in the impurity diffusion layer is not smaller than $5\times10^{17}$ atms/cm$^3$ and not larger than $5\times10^{19}$ atms/cm$^3$,
a diffusion depth of the impurities in the impurity diffusion layer is not smaller than 1 μm and not larger than 2.9 μm from a top of the back surface,
a maximum value of an impurity concentration of the impurity diffusion layer is not lower than $7\times10^{17}$ atms/cm$^3$ and not higher than $7\times10^{19}$ atms/cm$^3$,
the impurity concentration of the impurity diffusion layer becomes the maximum value at a position not less than 0.1 μm and not more than 1 μm deep from the top of the back surface,
the electrode partially penetrates into the impurity diffusion layer by sintering, and a depth of the penetration is not smaller than 0.1 μm and not larger than 1.9 μm from the top of the back surface, and a cross-sectional area of the electrode is not smaller than 350 μm$^2$ and not larger than 1000 μm$^2$.

2. The back contact type solar cell according to claim 1, wherein
sheet resistance of the impurity diffusion layer is not smaller than 60Ω/□ and not larger than 150Ω/□.

3. The back contact type solar cell according to claim 1, wherein
the electrode is a sintered body containing at least glass frit, silver, and aluminum.

4. The back contact type solar cell according to claim 1, wherein the first conductive type is an n-type, and the second conductive type is a p-type.

5. A solar cell module, comprising:
a plurality of back contact type solar cells electrically connected to each other,
each of the plurality of back contact type solar cells comprising:
a first conductive type semiconductor substrate;
an impurity diffusion layer where second conductive type impurities are diffused, the impurity diffusion layer being on a back surface, as a non-light receiving surface, of the first conductive type semiconductor substrate; and an electrode in contact with the impurity diffusion layer, wherein
a surface concentration of the impurities in the impurity diffusion layer is not smaller than $5\times10^{17}$ atms/cm$^3$ and not larger than $5\times10^{19}$ atms/cm$^3$,
a diffusion depth of the impurities in the impurity diffusion layer is not smaller than 1 μm and not larger than 2.9 μm from a top of the back surface,
a maximum value of an impurity concentration of the impurity diffusion layer is not lower than $7\times10^{17}$ atms/cm$^3$ and not higher than $7\times10^{19}$ atms/cm$^3$,
the impurity concentration of the impurity diffusion layer becomes the maximum value at a position not less than 0.1 μm and not more than 1 μm deep from the top of the back surface,
the electrode partially penetrates into the impurity diffusion layer by sintering, and a depth of the penetration is not smaller than 0.1 μm and not larger than 1.9 μm from the top of the back surface, and a cross-sectional area of the electrode is not smaller than 350 μm$^2$ and not larger than 1000 μm$^2$.

6. A photovoltaic power generation system, comprising:
a plurality of solar cell modules electrically connected to each other,
each of the plurality of solar cell modules comprising a plurality of back contact type solar cells electrically connected to each other,
each of the plurality of back contact type solar cells comprising:
a first conductive type semiconductor substrate;
an impurity diffusion layer where second conductive type impurities are diffused, the impurity diffusion layer being on a back surface, as a non-light receiving surface, of the first conductive type semiconductor substrate; and
an electrode in contact with the impurity diffusion layer, wherein
a surface concentration of the impurities in the impurity diffusion layer is not smaller than $5\times10^{17}$ atms/cm$^3$ and not larger than $5\times10^{19}$ atms/cm$^3$,
a diffusion depth of the impurities in the impurity diffusion layer is not smaller than 1 μm and not larger than 2.9 μm from a top of the back surface,
a maximum value of an impurity concentration of the impurity diffusion layer is not lower than $7\times10^{17}$ atms/cm$^3$ and not higher than $7\times10^{19}$ atms/cm$^3$,
the impurity concentration of the impurity diffusion layer becomes the maximum value at a position not less than 0.1 μm and not more than 1 μm deep from the top of the back surface,
the electrode partially penetrates into the impurity diffusion layer by sintering, and a depth of the penetration is not smaller than 0.1 μm and not larger than 1.9 μm from the top of the back surface, and a cross-sectional area of the electrode is not smaller than 350 μm$^2$ and not larger than 1000 μm$^2$.

* * * * *